United States Patent [19]
Bohn

[11] Patent Number: 5,903,039
[45] Date of Patent: May 11, 1999

[54] ENHANCED-LIGHT-COLLECTION-EFFICIENCY SENSOR

[75] Inventor: David D Bohn, Fort Collins, Colo.

[73] Assignee: Hewlett-Packard Company, Palo Alto, Calif.

[21] Appl. No.: 08/893,020

[22] Filed: Jul. 15, 1997

[51] Int. Cl.$^6$ ............................................. H01L 31/0232
[52] U.S. Cl. ........................ 257/432; 257/436; 257/443
[58] Field of Search ................................. 257/443, 432, 257/436; 359/619–622, 625, 626

[56] References Cited

U.S. PATENT DOCUMENTS

| | | | |
|---|---|---|---|
| 4,689,291 | 8/1987 | Popovic et al. | 430/321 |
| 4,882,262 | 11/1989 | Wilwerding | 430/321 |
| 5,298,366 | 3/1994 | Iwasaki et al. | 430/321 |
| 5,453,876 | 9/1995 | Hamada | 359/625 |
| 5,610,390 | 3/1997 | Miyano | 257/432 |

*Primary Examiner*—Minh Loan Tran
*Attorney, Agent, or Firm*—Morley C. Tobey, Jr.

[57] ABSTRACT

A microlens and microlens array which collect light incident upon image sensor pixels. The microlens comprises two parts one which collects light from the cross-sectional area lying over the light-detection area and the second which collects light from the corner areas of the pixel lying outside the cross-sectional area of the light-detection area. Light from each of the two areas is refracted onto an associated light-detection area. Essentially all of the light incident upon the pixel can thus be collected and refracted to the photosensitive area.

10 Claims, 8 Drawing Sheets

ENHANCED-LIGHT-COLLECTION-EFFICIENCY SENSOR

BACKGROUND OF THE INVENTION

1. Field of the Invention

This invention relates generally to microlens arrays and image sensors.

2. Description of Related Art

Light sensors are often combined in either linear or two-dimensional configurations for the purposes of image detection. Individual light sensors within the image sensor provide output signals whose magnitudes correspond to the light intensity incident upon them from a given area of the source object. The detected light intensity and corresponding output signal pattern of the light sensors thus forms a linear or two-dimensional representation of the source object or image.

In many situations, solid-state image sensors such as charged coupled devices (CCD's), complementary metal-oxide-semiconductor (CMOS), and other solid-state electronic devices are required to detect low or marginal light intensities. In these instances, even small losses in detectable light are of significant importance. Various means are available to the image sensor system designer for enhancing the system's ability to detect low light signals. These means often include (1) the increase of the light detection area of the sensor, (2) the addition of active circuitry for signal amplification, (3) the time integration of the light signal, (4) the increase of light collected by the imaging optics, and (5) the addition of microlenses to collect more of the incident light. All of these techniques are valuable and commonly employed, dependent upon the application and technology used for detection.

Typically an individual light sensor comprises a light-detection area and a non-light-detection area with associated supporting items such as electronic circuitry, interconnecting metal traces, and isolation diffusions. The light sensor often occupies a square or rectangular area of the image sensor. This area is referred to as a pixel. Light incident upon the non-light-detection area within the pixel is lost unless some means, such as a microlens, is employed to deflect it to the light-detection area of the light sensor, thereby collecting light that would otherwise have been lost. Microlenses typically have circular cross-sections in a plane parallel to the detection plane of the light sensor. Other cross-sections, however, have been proposed. The perimeter of the microlens is inscribed within the boundaries of its associated pixel and obviously collects light only within that perimeter. Previous systems have not attempted to collect light from the corner areas of the pixel.

As an example of the light which can potentially be lost from a pixel, refer to FIGS. 1A–1D and TABLE A. From FIG. 1A and TABLE A, it is seen that a circular lens inscribed within a square pixel and occupying the maximum possible area will be unable to collect approximately 21.5% of the incident light due to the inability of the circular cross-section of the microlens to cover the corners of the pixel. Referring to TABLE A, the square collection area of FIG. 1B, the hexagon collection area of FIG. 1C, and the octagon collection area of FIG. 1D respectively lose approximately 50%, 35.1%, and 17.2% of the light incident upon their corner areas. The particular geometries of FIGS. 1A–1D were chosen for illustrative purposes.

From the above discussion, it is clear that there is a need for further improvements in the percentages of available light collected in image sensors and similar light-detection devices.

TABLE A

Fractional Loss of Corner Area Incident Light

| Lens Cross-Section: | Circle | Square | Hexagon | Octagon |
| --- | --- | --- | --- | --- |
| Fractional Loss: | 0.215 | 0.500 | 0.351 | 0.172 |

As = Area of Square Pixel
Anc = Maximum Non-Corner Area of Light Collection
Fractional Loss of Corner Area Incident Light = [1 − (Anc/As)]

SUMMARY OF THE INVENTION

Representative embodiments of the light sensors described in the present patent document provide enhanced-light-collection capabilities not previously available. Using these teachings, it is possible to collect essentially all of the incident light, a capability that is especially advantageous for image sensors operating in low light intensity situations.

In a representative embodiment, an enhanced-light-collection-efficiency sensor comprises a pixel and an enhanced-light-collection-efficiency microlens. The enhanced-light-collection-efficiency microlens is placed between the pixel and a light or image source. The pixel of the light sensor comprises a light-detection area and a non-light-detection area. The non-light-detection area does not contribute directly to light detection, but may contain electronic circuitry, interconnecting metal traces, and areas used for isolating the light-detection area of the light sensor. This non-light-detection area is often covered with metal in order to protect underlying electronic structures or electronic circuitry from the effects of the light incident from the light source or image. The light-detection area typically has a polygon shaped perimeter and lies within or, at most, touching a pixel typically of rectangular area. The microlens in this representative embodiment comprises one or more corner microlenses located in the corner areas of the pixel. The light incident upon these corner microlenses is refracted at the corner microlens surface from the non-light-detection area onto the light-detection area.

Another part of the enhanced-light-collection-efficiency microlens, a light-transmitting microlens, is located over the light-detection area and between it and the light source. The surface of the light-transmitting microlens which faces the light source collects any light which would otherwise be incident upon the light-detection area and simply transmits or refracts that light onto any part of the light-detection area. Thus, the light-transmitting microlens may be nothing more than a flat light-transmitting material.

Representative embodiments of the invention also may be implemented using various polygon cross-sectional shapes perpendicular to the line of light propagation for the light-detection areas. These various polygon shapes consist of, but are not limited to, triangles, squares, pentagons, hexagons, heptagons, octagons, nonagons, decagons, undecagons, and dodecagons. However, other embodiments are possible, and the embodiments of the present patent document are not limited to these geometries. In addition, representative embodiments of individual light sensors, as taught in the present patent document, may be combined into linear and area arrays.

In representative embodiments, it is possible to collect essentially all of the light incident upon a pixel.

Other aspects and advantages of the light sensors of the present patent document will become apparent from the following detailed description, taken in conjunction with the accompanying drawings, illustrating by way of example the principles of the invention. The details disclosed in the specification should not be read so as to limit the invention.

BRIEF DESCRIPTION OF THE DRAWINGS

The accompanying drawings provide visual representations which will be used to more fully describe the representative embodiments of the present patent document and which can be used by those skilled in the art to better understand them and their inherent advantages. In these drawings, like reference numerals identify corresponding elements and:

FIGS. 1A–1D are top views of various square pixel light sensor devices. FIG. 1A has a circular microlens cross-sectional collection area; FIG. 1B has a square microlens cross-sectional collection area; FIG. 1C has a hexagon microlens cross-sectional collection area; and FIG. 1D has an octagon microlens cross-sectional collection area.

FIGS. 5A–5K are top views of various embodiments of enhanced-light-collection-efficiency sensors having various shaped light-detection areas.

DESCRIPTION OF THE PREFERRED EMBODIMENT

As shown in the drawings for purposes of illustration, the present patent document describes, in representative embodiments, novel enhanced-light-collection-efficiency sensors and enhanced-light-collection-efficiency sensor arrays for use in image detection systems. Previous light sensors and associated microlenses used in image detection systems have experienced significant loss of light signal due to their design. In the following detailed description and in the several figures of the drawings, like elements are identified with like reference numerals.

Embodiments described in the present patent document do not depend upon whether or not the incident light is received directly from an active light source or is reflected from an image. As such, the term light source, as used herein, is synonymous with image source. Also, pixel geometries are described in the present patent document as squares or rectangles. It is noted that a square is, in fact, a special case of a rectangle wherein all sides are equal. While pixels in image sensors are typically rectangles, or squares in the special case of a rectangle of equal sides, embodiments of the present patent document are not limited to such pixel geometries.

In many situations, solid-state image sensors such as charged coupled devices (CCD's), complementary metal-oxide-semiconductor (CMOS), and other solid-state electronic devices are required to detect low or marginal light intensities. In these instances, even small losses in detectable light are of significant importance.

By collecting light from areas peripheral to the light-detection areas that is lost in previous individual and array light sensors, representative embodiments of the light sensors and associated microlenses of the present patent document provide enhanced-light-collection capabilities over previous devices. In these embodiments, any associated electronic circuitry that may be used for amplifying the light signal may be placed in the corner areas of the pixels, or any other convenient places either within or external to the pixels. As will become clear in the following, the teachings of the present patent document provide the ability to collect essentially all of the light incident upon the pixels in an image sensor or other light sensitive device.

Figure 1A:
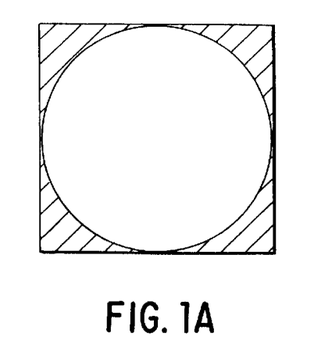
Figure 1B:
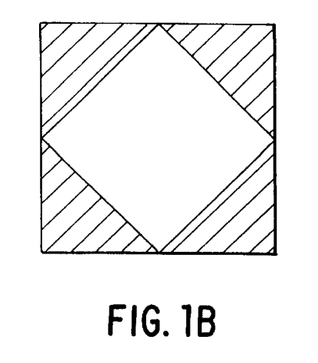
Figure 1C:
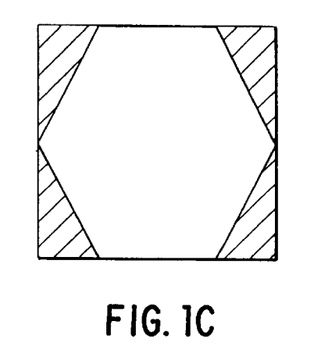
Figure 1D:
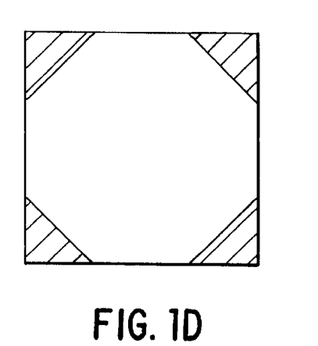
Figure 2A:
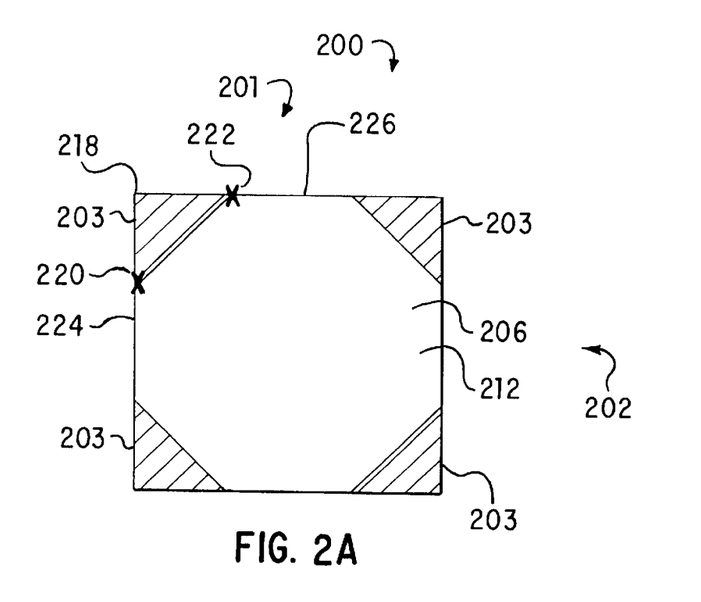
FIG. 2A is a top view of an enhanced-light-collection-efficiency sensor for an octagon shaped light-detection area within a square pixel.

FIG. 2A is a top view of a representative embodiment of an enhanced-light-collection-efficiency sensor 200 of the present patent document. An enhanced-light-collection-efficiency microlens 202 is inscribed within a pixel 201. The enhanced-light-collection-efficiency microlens 202 comprises a corner microlens 203 in each of the four corners of the pixel 201 and a light-transmitting microlens 206. While other geometries are possible, the light-transmitting microlens 206 for this embodiment has an octagon shape.

Figure 2B:
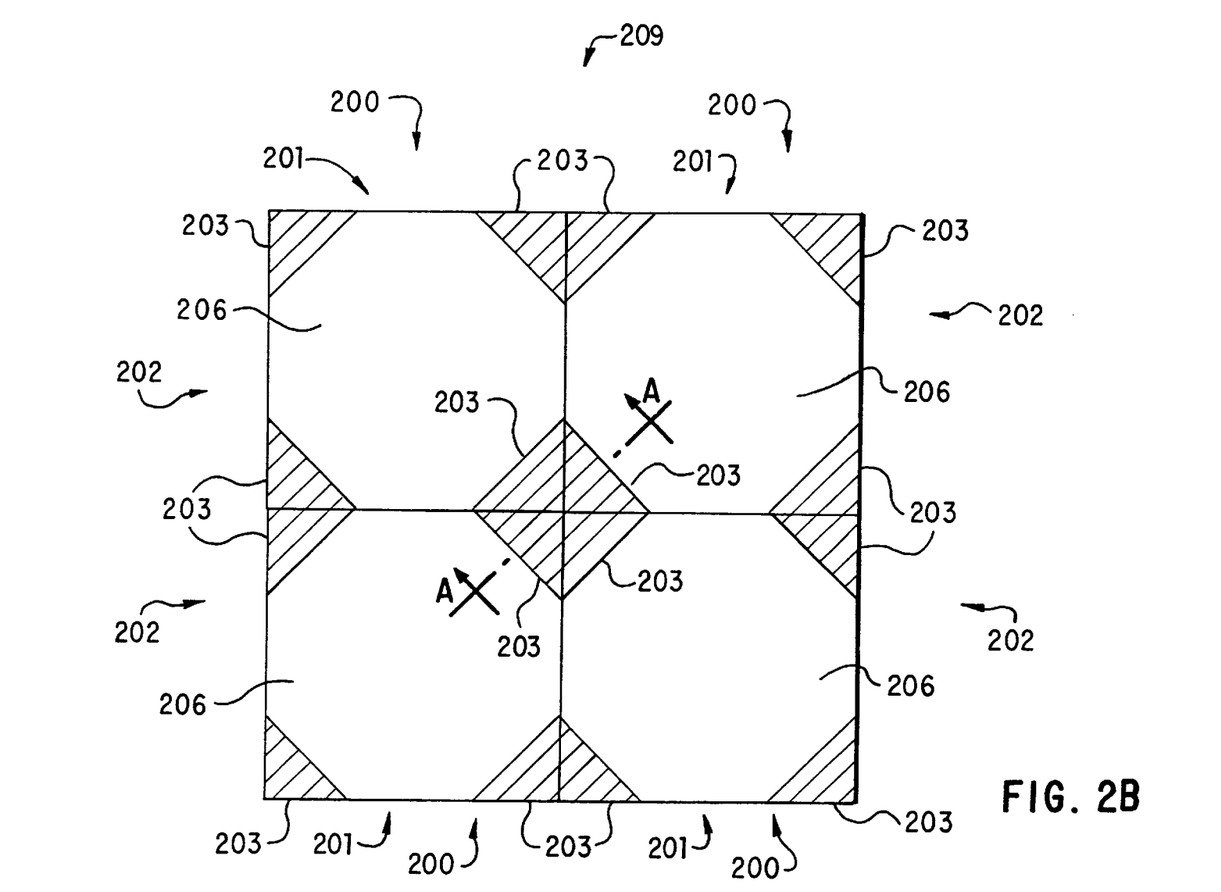
FIG. 2B is a top view of an array of four enhanced-light-collection-efficiency sensors.

FIG. 2B is a top view of an enhanced-light-collection-efficiency sensor array 209 comprising four enhanced-light-collection-efficiency sensors 200 in four adjacent pixels 201.

Figure 2C:
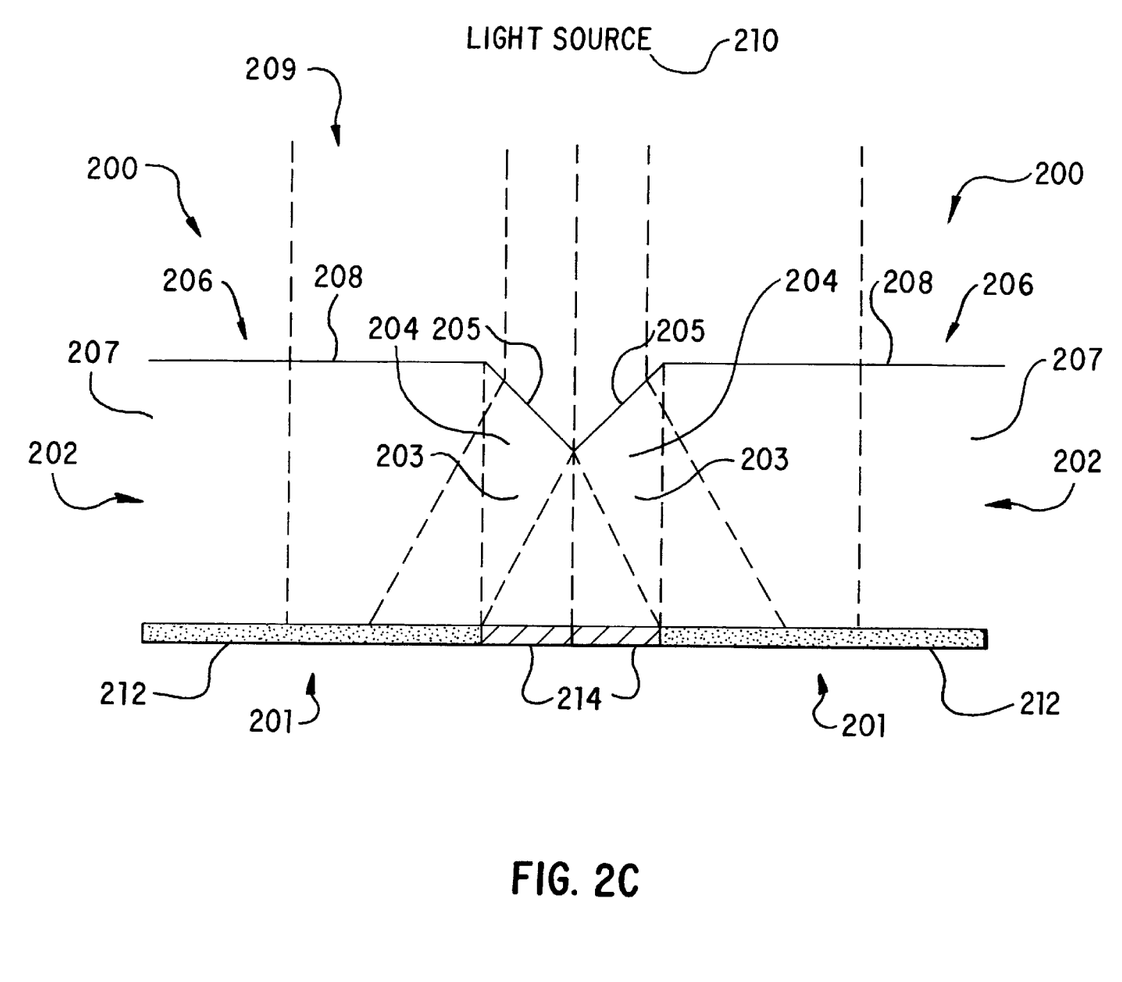
FIG. 2C is a drawing of a section of the enhanced-light-collection-efficiency sensor array of FIG. 2B on line A—A.

FIG. 2C is a drawing of a section of the enhanced-light-collection-efficiency sensor array 209 on line A—A of FIG. 2B. In FIG. 2C, a part of the light from a light source 210 is shown incident upon two adjacent enhanced-light-collection-efficiency sensors 200 of the enhanced-light-collection-efficiency sensor array 209. The enhanced-light-collection-efficiency microlens 202 comprises the corner microlens 203 and the light-transmitting microlens 206. The corner microlens 203 is comprised of a corner microlens body 204 with a corner microlens surface 205 facing the light source 210. The light-transmitting microlens 206 is comprised of a light-transmitting microlens body 207 with a light-transmitting microlens surface 208 facing the light source 210. Both the corner microlens 203 and the light-transmitting microlens 206 are fabricated from light-transmitting materials. The light from the light source 210 is shown incident upon corner microlens surfaces 205 of two adjacent corner microlenses 203. Light, which would otherwise be incident upon a non-light-detection area 214 of the pixel 201, is refracted onto a light-detection area 212 of the pixel 201. Note that FIGS. 2A–2C are drawn neglecting any isolation region between the light-detection areas 212 of adjacent pixels 201. Light incident upon these isolation regions may be collected by extending the corner microlenses 203 to include such areas.

Again referring to FIG. 2C, a part of the light from the light source 210 is incident upon the light-transmitting microlens 206 of the enhanced-light-collection-efficiency microlens 202. Since the light-detection area 212 is of substantially the same geometry as the light-transmitting microlens 206 and lies directly below it, the light-transmitting microlens 206 may simply transmit the light incident on it to the light-detection area 212 without refraction by constructing it of a flat sheet of optically transparent material. However, any form of refraction, such as magnification or dispersion, by the light-transmitting microlens 206 also follows the teachings of the present patent document, so long as substantially all of the light incident on the light-transmitting microlens 206 is incident on the light-detection area 212.

Referring back to FIG. 2A, a representative embodiment is shown wherein the light-detection area 212 has a polygon shaped geometry and the perimeter of the light-detection area 212 intersects the perimeter of the pixel 201. The corner microlens 203 for this embodiment is bounded by a vertex 218 of the pixel 201, a first nearest point 220, and a second nearest point 222. The first nearest point 220 is chosen by first determining the set of all points on the perimeter of the light-detection area 212 nearest a first adjacent side 224 wherein the first adjacent side 224 is one of the sides of the pixel 201 which intersects the vertex 218. The set of all points on the perimeter of the light-detection area 212 nearest the first adjacent side 224 for this drawing is the line segment in which the light-detection area 212 intersects the first adjacent side 224. Within this set of points, the point closest to the vertex 218 is defined to be the first nearest point 220. The second nearest point 222 is chosen in a similar manner by first determining the set of all points on the perimeter of the light-detection area 212 nearest a second adjacent side 226 wherein the second adjacent side 226 is the other side of the pixel 201 which intersects the vertex 218. The set of all points on the perimeter of the light-detection area 212 nearest the second adjacent side 226 for this drawing is the line segment in which the light-detection area 212 intersects the second adjacent side 226. Within this set of points, the point closest to the vertex 218 is defined to be the second nearest point 222.

Figure 3A:
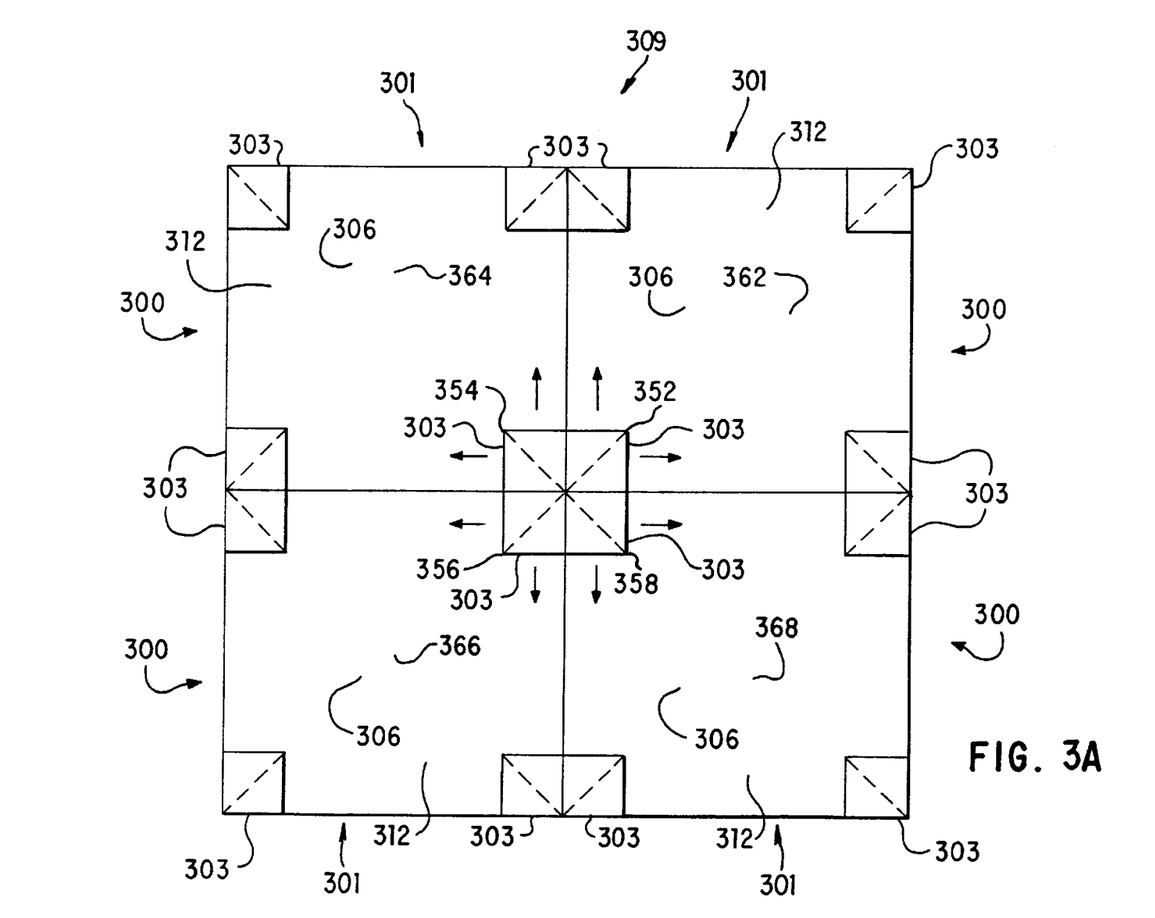
FIG. 3A is a top view of another representative embodiment of the teachings of the present patent document wherein the light-detection areas are formed from squares whose sides are essentially parallel to square pixels and whose corner areas are cut out.
Figure 3B:
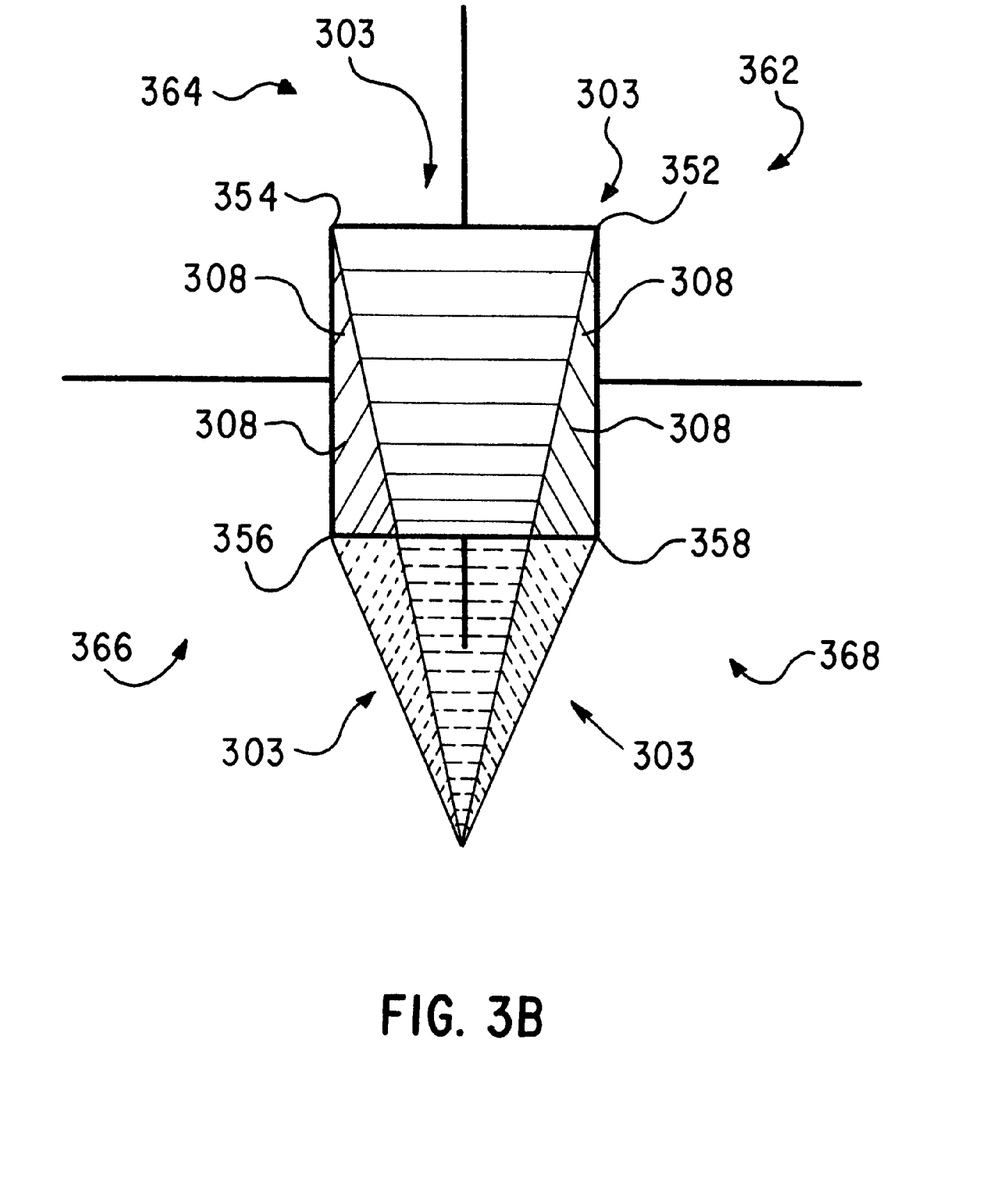
FIG. 3B is a three dimensional sketch of four adjacent corner microlenses.

FIGS. 3A–3B are drawings of another representative embodiment of the teachings of the present patent document wherein the perimeter of a light-detection area 312 is formed by first constructing a square whose sides are substantially parallel to a pixel 301 and then removing corner areas from that square. A corner microlens 303 is located over each of the cut-out areas of the light-detection areas 312. Four enhanced-light-collection-efficiency sensors 300 are combined to form an enhanced-light-collection-efficiency sensor array 309. FIG. 3A is a drawing of a top view of this configuration while FIG. 3B is a three dimensional sketch of a combination of four adjacent corner microlenses 303 defined, in part, by vertices 352, 354, 356, 358. In order to facilitate understanding of these drawings, four adjacent light-detection areas 312 are indicated as 362, 364, 366, 368.

In this case, corner microlens surfaces 308 of the corner microlenses 303 refract light onto the light-detection areas 312 of four adjacent pixels 301. In the case of FIGS. 3A–3B, the four facets of the adjacent microlenses refract light onto the light-detection areas 312 of four adjacent pixels 301 as indicated by the arrows in FIG. 3A.

Other embodiments for various cross-sectional shapes of the light-detection areas 212 of FIGS. 2A–2C and 312 of FIGS. 3A–3B may also be constructed using the teachings of the present patent document. In particular perpendicular to the line of light propagation, the cross-sectional shape of the light-detection area 212,312 could be any regular or irregular polygon such as, but not limited to, a triangle, a square, a rectangle, a pentagon, a hexagon, a heptagon, an octagon, a nonagon, a decagon, an undecagon, a dodecagon, or for that matter it could be any cross-sectional geometry including curved and circular shapes.

Figure 4:
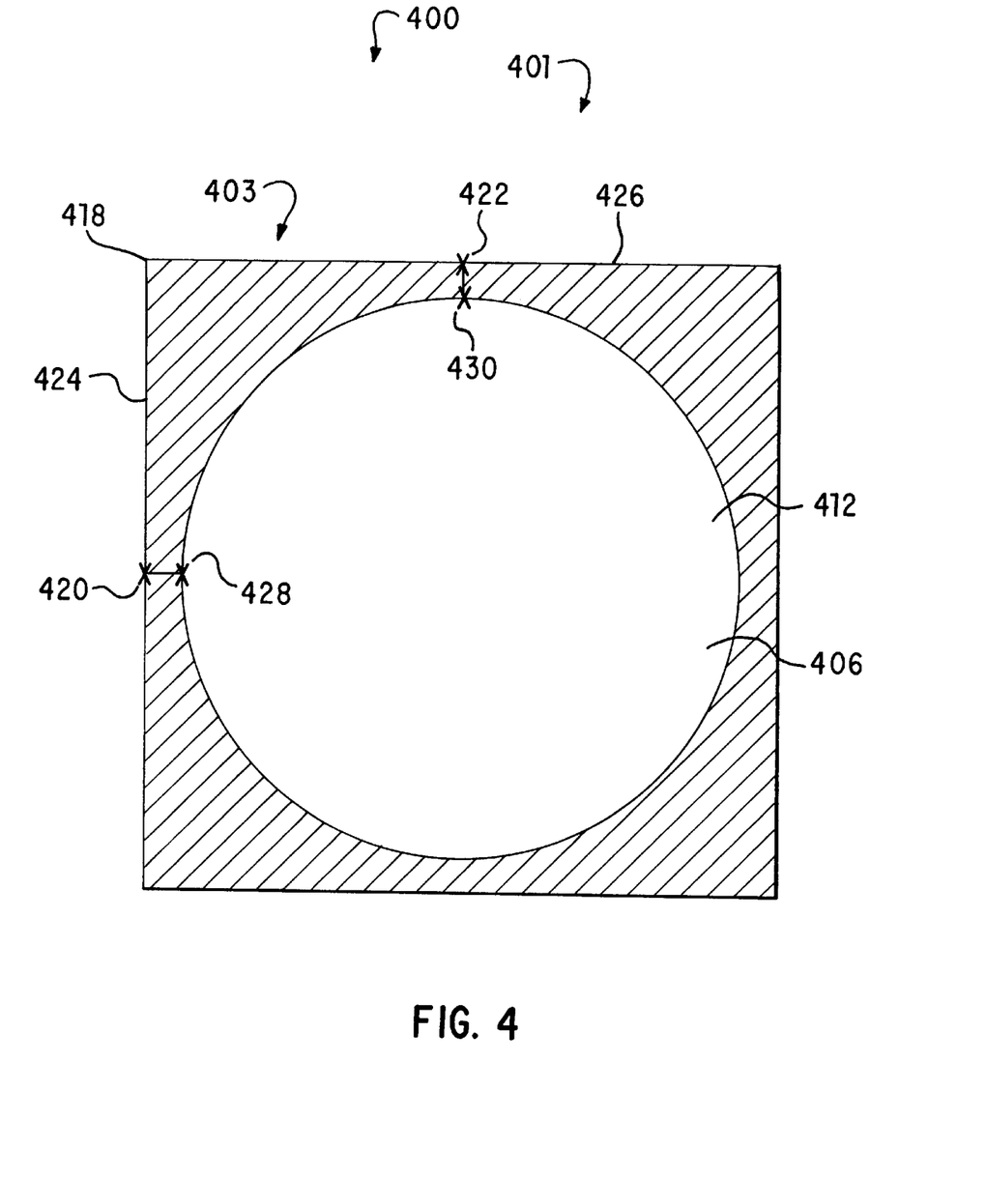
FIG. 4 is a top view of still another representative embodiment of the teachings of the present patent document wherein the light-detection area is a circle located within a square pixel.

FIG. 4 is a top view of another representative embodiment of an enhanced-light-collection-efficiency sensor 400 wherein a light-detection area 412 has a circular geometry with a perimeter which does not intersect the perimeter of a pixel 401. A corner microlens 403 for this embodiment is bounded as specified in the following. A first adjacent side 424 is identified wherein the first adjacent side 424 is one of the two sides of the pixel 401 which intersects a vertex 418 of the pixel 401. Since the light-detection area 412 does not contact the perimeter of the pixel 401, a first nearest point 420 is chosen to be the mid-point of the projection onto the first adjacent side 424 of the set of all points on the perimeter of the light-detection area 412 closest to the first adjacent side 424. Since in this embodiment, there is only one point on the perimeter of the light-detection area 412 that is closest to the first adjacent side 424, this mid-point is chosen from a set of points consisting of only a single point. A second adjacent side 426 is identified wherein the second adjacent side 426 is the second of the two sides of the pixel 401 which intersects the vertex 418. Since the light-detection area 412 does not contact the perimeter of the pixel 401, a second nearest point 422 is chosen to be the mid-point of the projection onto the second adjacent side 426 of the set of all points on the perimeter of the light-detection area 412 closest to the second adjacent side 426. Again, since in this embodiment, there is only one point on the perimeter of the light-detection area 412 that is closest to the second adjacent side 426, this mid-point is chosen from a set of points consisting of only a single point. The corner microlens 403 is bounded by the vertex 418, the first nearest point 420, the second nearest point 422, a first projection point 428 which is the projection of the first nearest point 420 onto the perimeter of the light-detection area 412, a second projection point 430 which is the projection of the second nearest point 422 onto the perimeter of the light-detection area 412, and the perimeter of the light-detection area 412 lying between the first projection point 428 and the second projection point 430. The curvature and vertical placement of the corner microlens 403 is defined so as to refract substantially all of the light incident on the corner microlens 403 onto the light-detection area 412. A light-transmitting microlens 406 may also be placed over the light-detection area 412 as in other representative embodiments discussed above.

Figure 5A:
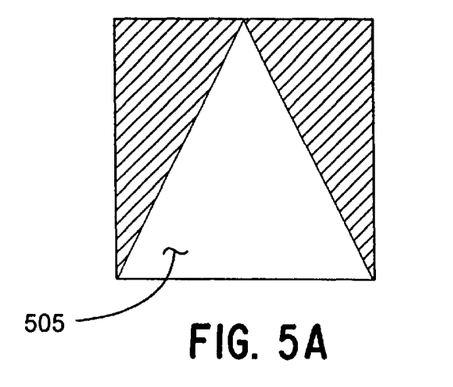
FIG. 5A is a top view of the enhanced-light-collection-efficiency sensor wherein the shape of the light-detection area is a triangle.
Figure 5B:
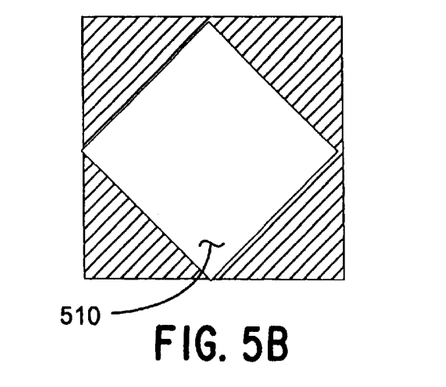
FIG. 5B is a top view of the enhanced-light-collection-efficiency sensor wherein the shape of the light-detection area is a square.
Figure 5C:
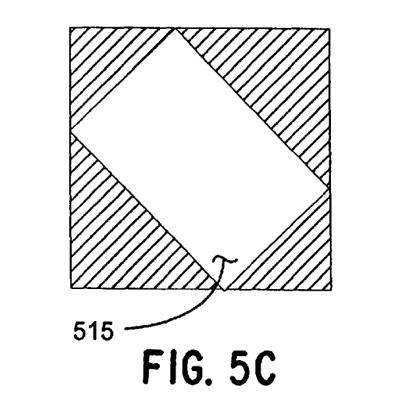
FIG. 5C is a top view of the enhanced-light-collection-efficiency sensor wherein the shape of the light-detection area is a rectangle.
Figure 5D:
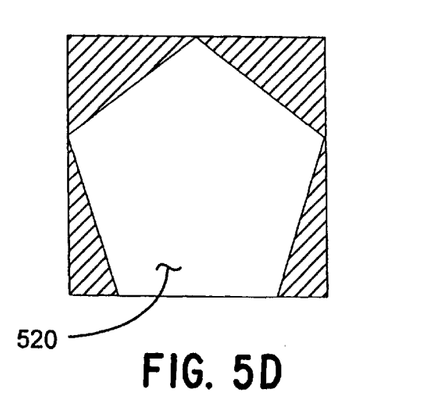
FIG. 5D is a top view of the enhanced-light-collection-efficiency sensor wherein the shape of the light-detection area is a pentagon.
Figure 5E:
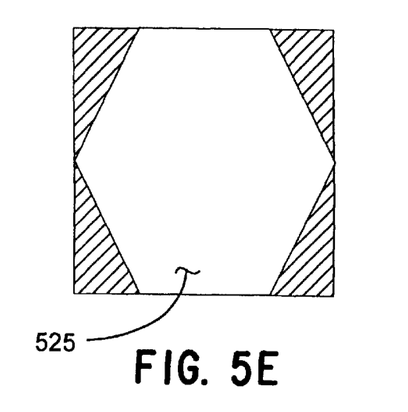
FIG. 5E is a top view of the enhanced-light-collection-efficiency sensor wherein the shape of the light-detection area is a hexagon.
Figure 5F:
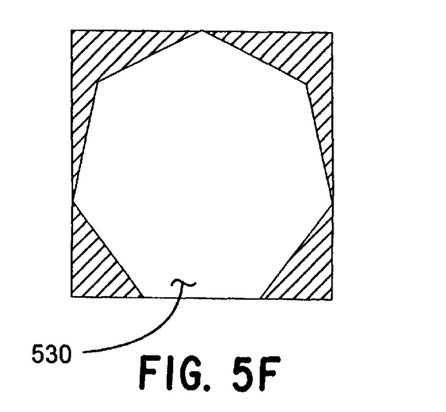
FIG. 5F is a top view of the enhanced-light-collection-efficiency sensor wherein the shape of the light-detection area is a heptagon.
Figure 5G:
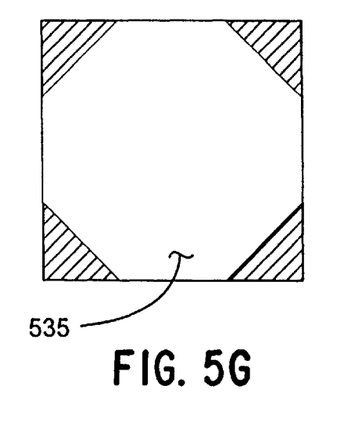
FIG. 5G is a top view of the enhanced-light-collection-efficiency sensor wherein the shape of the light-detection area is a octagon.
Figure 5H:
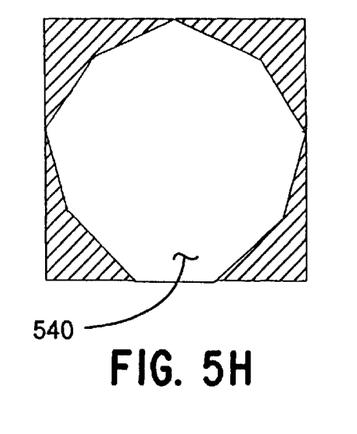
FIG. 5H is a top view of the enhanced-light-collection-efficiency sensor wherein the shape of the light-detection area is a nonagon.
Figure 5I:
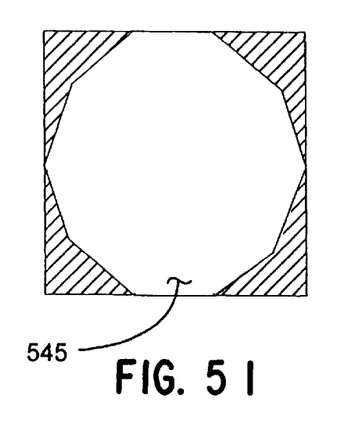
FIG. 5I is a top view of the enhanced-light-collection-efficiency sensor wherein the shape of the light-detection area is a decagon.
Figure 5J:
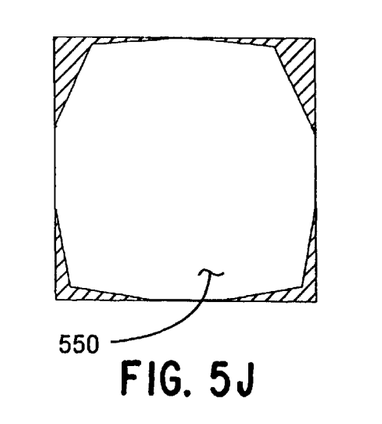
FIG. 5J is a top view of the enhanced-light-collection-efficiency sensor wherein the shape of the light-detection area is a undecagon.
Figure 5K:
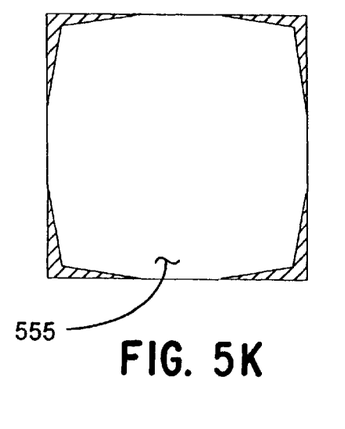
FIG. 5K is a top view of the enhanced-light-collection-efficiency sensor wherein the shape of the light-detection area is a dodecagon.

FIGS. 5A–5K are top views of various embodiments of enhanced-light-collection-efficiency sensors having various shaped light-detection areas. FIG. 5A is a top view of the enhanced-light-collection-efficiency sensor wherein the shape of the light-detection area is a triangle 505; FIG. 5B is a top view of the enhanced-light-collection-efficiency sensor wherein the shape of the light-detection area is a square 510; FIG. 5C is a top view of the enhanced-light-collection-efficiency sensor wherein the shape of the light-detection area is a rectangle 515; FIG. 5D is a top view of the enhanced-light-collection-efficiency sensor wherein the shape of the light-detection area is a pentagon 520; FIG. 5E is a top view of the enhanced-light-collection-efficiency sensor wherein the shape of the light-detection area is a hexagon 525; FIG. 5F is a top view of the enhanced-light-collection-efficiency sensor wherein the shape of the light-detection area is a heptagon 530; FIG. 5G is a top view of the enhanced-light-collection-efficiency sensor wherein the shape of the light-detection area is a octagon 535; FIG. 5H is a top view of the enhanced-light-collection-efficiency sensor wherein the shape of the light-detection area is a nonagon 540; FIG. 5I is a top view of the enhanced-light-collection-efficiency sensor wherein the shape of the light-detection area is a decagon 545; FIG. 5J is a top view of the enhanced-light-collection-efficiency sensor wherein the shape of the light-detection area is a undecagon 550; and FIG. 5K is a top view of the enhanced-light-collection-efficiency sensor wherein the shape of the light-detection area is a dodecagon 555.

Other embodiments using the teachings of the present patent document can be constructed wherein, for example, the perimeter of the light-transmitting microlens 206,306, 406 does not follow the perimeter of the light-detection area 212,312,412. However, the corner microlenses 203,303,403 and the light-transmitting microlens 206,306,406 in these embodiments are constructed so as to refract essentially all of the light incident on the pixel 201,301,401 onto the light-detection area 212,312,412.

Embodiments of the microlens of the present patent document, as described herein, are especially useful in applications wherein the level of light detected is marginal with respect to that needed for accurate and reliable detection. In such situations, the loss of even small losses of light is critical.

What is claimed is:

1. A light sensor for the collection and detection of light from a light source, comprising:
   a pixel comprising;
      a light-detection area, and
      a non-light-detection area; and
   a microlens, located over the non-light-detection area, over a corner area of the pixel, and between the light source and the pixel, comprising;
      a microlens body made from an optically transmitting material; and
      a microlens surface shaped and positioned at a distance from the plane of the pixel so as to refract onto the light-detection area essentially all of the light from the light source otherwise incident onto the non-light-detection area.

2. The light sensor as in claim 1 wherein:
the shape of the perimeter of the light-detection area is a circle.

3. The light sensor as in claim 1 wherein:
the shape of the pixel is a rectangle; and
the shape of the light-detection area is formed from a rectangle with sides substantially parallel to that of the pixel and with at least one rectangular corner cutout.

4. The light sensor as in claim 1 wherein:
the shape of the perimeter of the light-detection area is a polygon.

5. The light sensor as in claim 4 wherein:
the polygon shape of the light-detection area comprises a triangle, a square, a rectangle, a pentagon, a hexagon, a heptagon, an octagon, a nonagon, a decagon, a undecagon, or a dodecagon.

6. The light sensor as in claim 1 wherein the microlens is further located so that the microlens and the microlens surface are both essentially bounded in a plane parallel to the light-detection area by a vertex of the pixel, a first nearest point, wherein the first nearest point is chosen by first determining the set of all points on the perimeter of the light-detection area nearest a first adjacent side of the pixel connected to the vertex, then selecting the point of that set of points nearest the vertex, a second nearest point, wherein the second nearest point is chosen by first determining the set of all points on the perimeter of the light-detection area nearest a second adjacent side of the pixel connected to the vertex, then selecting the point of that set of points nearest the vertex, then connecting the vertex, the first adjacent point, the second adjacent point, with the perimeter of the light-detection area lying between the projection of the first nearest adjacent point on the perimeter of the light-detection area and the projection of the second nearest adjacent point on the perimeter of the light-detection area; and wherein the microlens surface is shaped and positioned at a distance above the plane of the light-detection area so as to refract onto the light-detection area light from the light source incident onto the microlens.

7. The light sensor as in claim 6 wherein:
the shape of the perimeter of the light-detection area is a circle.

8. The light sensor as in claim 6 wherein:
the shape of the pixel is a rectangle; and
the shape of the light-detection area is formed from a rectangle with sides substantially parallel to that of the pixel and with at least one rectangular corner cutout.

9. The light sensor as in claim 6 wherein:
the shape of the perimeter of the light-detection area is a polygon.

10. The light sensor as in claim 9 wherein:
the polygon shape of the light-detection area comprises a triangle, a square, a rectangle, a pentagon, a hexagon, a heptagon, an octagon, a nonagon, a decagon, a undecagon, or a dodecagon.

* * * * *